US006215661B1

(12) United States Patent
Messenger et al.

(10) Patent No.: US 6,215,661 B1
(45) Date of Patent: Apr. 10, 2001

(54) HEAT SPREADER

(75) Inventors: Thomas R. Messenger, Gilbert; Ian Mark Whiting, Tempe, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/372,292

(22) Filed: Aug. 11, 1999

(51) Int. Cl.[7] .................................................. H05K 7/20
(52) U.S. Cl. ..................... 361/704; 361/689; 361/690; 361/698; 361/699; 361/700; 361/702; 361/705; 361/706; 361/707; 257/706; 257/712; 257/714; 174/16.3; 174/15.2; 165/80.3; 165/80.4; 165/185
(58) Field of Search .............................. 361/689, 690, 361/700, 704–710, 717, 718; 257/706, 712; 165/80.2, 80.3, 185; 174/252

(56) References Cited

U.S. PATENT DOCUMENTS

| 5,467,814 | * | 11/1995 | Hyman et al. | ......................... 165/41 |
| 5,806,803 | * | 9/1998 | Watts | ...................................... 165/41 |
| 5,931,222 | * | 8/1999 | Toy et al. | ............................. 165/80.3 |
| 5,958,556 | * | 9/1999 | McCutcheon | ........................ 428/172 |
| 6,075,701 | * | 6/2000 | Ali et al. | ............................... 361/704 |

FOREIGN PATENT DOCUMENTS

408015053 * 1/1996 (JP) .

* cited by examiner

Primary Examiner—Leo P. Picard
Assistant Examiner—Boris L. Chervinsky
(74) Attorney, Agent, or Firm—Timothy J. Lorenz; Frank J. Bogacz

(57) ABSTRACT

An electronic package (10) designed to be mounted in a space vehicle includes active electronic components that produce heat energy during operation and has a shear plate (12) attached to a heat sink (13). A heat spreader (11) includes an L-shaped plate of thermal pyrolitic graphite encapsulated in aluminum, which has a long arm (20) attached to the shear plate (12) by a heat conductive adhesive and a short arm (21) attached to the heat sink (13) for transferring heat energy from the package (10) to the heat sink (13). Whereby the heat sink (13) and the package (10) produce a dynamic load and the heat sink (13) and the package (10) are designed to carry the dynamic load with the heat spreader (11) providing only thermal enhancement.

11 Claims, 1 Drawing Sheet

HEAT SPREADER

FIELD OF THE INVENTION

This invention relates to heat spreaders for electronic packages and the like. More particularly, the present invention relates to heat spreaders for electronic packages and the like which are used in satellites and other space vehicles.

BACKGROUND OF THE INVENTION

With the advent of the use of satellites and other space vehicles in communications systems, the problem of heat produced in active components and packages containing active components has become a substantially greater problem. It is, of course, understood by those skilled in the art that the weight carried by space vehicles must be minimized as much as possible. Thus, as more active electronic and other heat generatings components are installed on the space vehicles, there is less room and weight carrying ability left to increase the size of heat sinks, heat pipes, and other heat conducting components.

Several alternate solutions to the increased heat problem are presently being proposed and/or used in present day communications systems. In a first such prior art structure, the solution is to increase the cross-sectional dimensions of the shear panel of an electronic package carried by a space vehicle. It is of course understood that the shear panel is a side of the electronic panel by which the electronic panel is attached to a heat sink, heat pipe, etc. in the space vehicle. The shear panel is designed to take the dynamic load produced by the weight of the package during movement (e.g. carrying the space vehicle into space). Increasing the cross-sectional dimensions of the existing aluminum shear panel is ineffective due to the mass and volume impacts. For example, in order to increase the thermal performance to a level that matches the devices of this disclosure, a 1"×1"× 0.1" aluminum section would have to be increased in thickness from 0.1" to 0.69". This translates into a nearly 7× increase in mass. For most space applications this mass and volume increase is prohibitive.

In a second such prior art structure, the aluminum shear panel and package container can be made of a material with a higher thermal conductivity than aluminum. However, changing to a higher conductivity metal, such as copper, increases mass and decreases dynamic performance with only a modest gain in thermal conductivity over aluminum. Other materials increase cost and have fabrication limitations. For example, changing to a high conductivity graphite gives a better gain in thermal performance over aluminum but can substantially increase the cost of the part. Further, the high conductivity graphite has limitations in the form it can be made into due to bend radius restrictions.

In a third prior art structure, either original or additional heat pipes are added. Heat pipes have a slightly greater heat carrying capacity than any of the above structures, however limitations exist. For heat pipes to function with maximum efficiency when operated in gravity conditions (i.e. ground testing) they must be maintained in specific operating orientations. Also, attachment to a shear panel and heat sink is relatively difficult to achieve.

Accordingly it is highly desirable to provide apparatus which overcomes these problems and which is inexpensive and easy to install and use.

BRIEF DESCRIPTION OF THE DRAWINGS

Referring to the drawings.

DESCRIPTION OF THE PREFERRED EMBODIMENT

Figure 1:
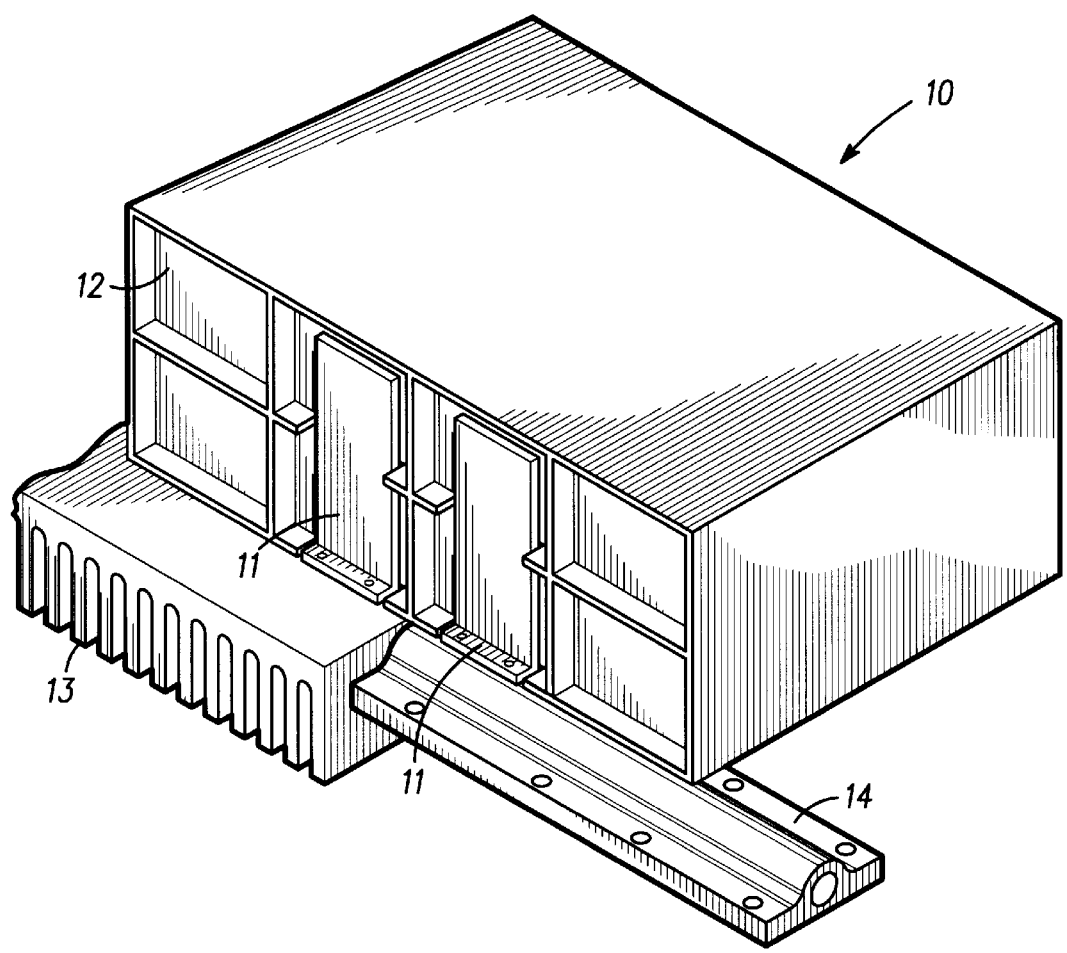
FIG. 1 is an isometric view of an active electronic package with heat spreader in accordance with the present invention.

Referring to the figures, FIG. 1, illustrates an active electronic package 10 which includes heat spreaders 11 affixed thereto in accordance with the present invention. Package 10, in this example, is constructed in the form of a box designed to be mounted in a space vehicle and containing active components (e.g. microprocessors, transmitters, receivers, switching units, etc.) which generate heat energy that must be dissipated. The box includes sides formed of aluminum and a shear panel 12 designed to mount package 10 to a heat sink 13 or, in some special applications, to a heat pipe 14. The operation of shear panel 12 is well known in the art and will not be elaborated upon further.

In fashions well known in the art, the various heat energy sources within package 10 are mounted to conduct the generated heat to shear panel 12 by various heat paths within package 10. Shear panel 12 then conducts as much heat as it can to heat sink 13 and/or to heat pipe 14. As explained above, the problem that arises is that shear panel 12 can only conduct a limited amount of heat energy and any additional components or additional power generated within package 10 places a higher requirement on shear panel 12 which must be rectified.

Figure 2:
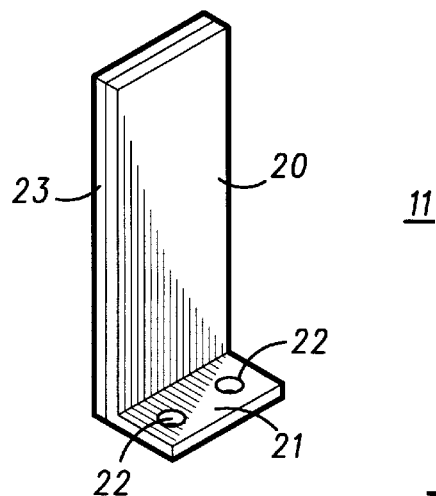
FIG. 2 is an enlarged isometric view of a single heat spreader from the package illustrated in FIG. 1.

Since all of heat spreaders 11 are similar in this specific example, only one will be discussed in detail herein but it should be understood that one or a plurality can be used, depending upon the specific application. Referring additionally to FIG. 2, heat spreader 11 for active electronic package 10 is fabricated in the form of an L-shaped plate having a long arm 20 and a short arm 21. Long arm 20 is designed to be attached to a flat surface of active electronic package 10 for receiving thermal energy from the package. In a preferred embodiment, long arm 20 is affixed to the surface of shear panel 12 to better aid shear panel 12 in conducting heat to heat sink 13 and/or heat pipe 14. Short arm 21 is integrally formed with long arm 20 and is designed to be fixedly attached to heat sink 13 and/or heat pipe 14.

While long arm 20 of heat spreader 11 can be attached to shear panel 12 of package 10 by any convenient means that conducts heat efficiently (e.g. screws, solder, welding, etc.), a preferred embodiment is to use a heat conductive adhesive 23, such as a heat conductive epoxy or the like (many of which are commercially available). Short arm 21 is connected to heat sink 13 and/or heat pipe 14 using a similar material, or by using screws, etc. in holes 22. Again, any convenient means that conducts heat efficiently may be used. Here it should be specifically noted that package 10 and heat sink 13 produce a dynamic load, especially during launches and the like, which dynamic load is carried by shear panel 12. In fact, shear panel 12 is provided specifically for the purpose of carrying the dynamic load produced by package 10. Heat spreader 11 is designed only for providing thermal enhancement to package 10 and is not designed to carry any of the dynamic load.

While heat spreader 11 can be fabricated from a variety of heat conducting materials, because of its simple form and low to zero dynamic load mounting, in this preferred embodiment it is fabricated from thermal pyrolitic graphite encapsulated in aluminum. Advanced Ceramics Corporation has developed a technique which encapsulates high conductivity thermal pyrolitic graphite in a metal or composite shell. Encapsulant shell materials include aluminum, copper, AlSiC, SiC, and graphite fiber. Designations for the resulting composite structure for the aluminum, copper AlSiC, and graphite configurations are TC1050.ALY, TC1050.COP, TC1050.MMC, and TC1050.CFC, respectively. By attaching heat spreader 11 to shear panel 12, shear panel 12 allows the existing structure to carry the dynamic load while heat spreader 11 enhances the thermal performance.

Thus, heat spreader 11 can be formed of a variety of high heat conductive materials, because of its simple shape and non-structural mounting. Heat spreader 11 can be easily attached to existing packages 10 with very minor or no modifications. Also, heat spreader 11 carries approximately the same amount of heat as a heat pipe but is gravity insensitive, so as to allow multi-directional earth testing of package 10. Further, in order to increase the thermal performance of shear panel 12 to a level that matches the thermal performance of heat spreader 11, a 1"×1"×0.1", heat spreader 11 would have to be increased in thickness from 0.1" to 0.69". This translates into a nearly 7× increase in mass, so that it can be seen that heat spreader 11 has substantial advantages over any of the structures included or suggested in the prior art.

A heat spreader has been disclosed, for use with active electronic packages, which heat spreader includes an L-shaped plate of thermal pyrolitic graphite encapsulated in aluminum. The L-shaped plate has a long arm designed to be attached to a flat surface of an active electronic package for receiving thermal energy from the package and a short arm designed to be attached to a surface of a heat sink for transferring energy to the heat sink. The heat spreader can be easily attached to existing or new electronic packages and can be formed from a variety of high heat conductive materials because of its simple form and because it does not carry the dynamic loads of the package.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A heat spreader for an active electronic package comprising an L-shaped plate of thermal pyrolitic graphite encapsulated in aluminum, the L-shaped plate having a long arm designed to be attached to a flat surface of the active electronic package for receiving thermal energy from the active electronic package and a short arm designed to be attached to a surface of a heat sink for transferring energy to the heat sink.

2. An active electronic package with a heat spreader comprising:
a heat sink;
a package containing active electronic components that produce heat energy during operation, the package having at least one heat conductive flat surface in a heat path for the heat energy, and the package being operatively mounted adjacent the heat sink; and
an L-shaped plate of thermally conductive material encapsulated in a heat conductive metal, the L-shaped plate having a long arm attached to the at least one heat conductive flat surface of the package for receiving thermal energy from the package and a short arm attached to the heat sink for transferring energy to the heat sink.

3. An active electronic package with a heat spreader as claimed in claim 2 wherein the thermally conductive material includes thermal pyrolitic graphite.

4. An active electronic package with a heat spreader as claimed in claim 2 wherein the heat conductive metal includes one of aluminum, copper, SiC, AlSiC, and graphite.

5. An active electronic package with a heat spreader as claimed in claim 4 wherein the L-shaped plate includes pyrolitic graphite encapsulated in aluminum.

6. An active electronic package with a heat spreader as claimed in claim 2 wherein the L-shaped plate is attached to the at least one heat conductive flat surface of the package by a layer of thermal adhesive.

7. An active electronic package with a heat spreader as claimed in claim 6 wherein the layer of thermal adhesive includes heat conductive epoxy.

8. An active electronic package with a heat spreader as claimed in claim 2 wherein the at least one heat conductive flat surface of the package is a shear panel.

9. An active electronic package with a heat spreader as claimed in claim 2 wherein the heat sink and the package containing active electronic components and the attached L-shaped plate are designed for use in light weight applications.

10. An active electronic package with a heat spreader as claimed in claim 9 wherein the heat sink and the package produce a dynamic load and the heat sink and the package are designed to carry the dynamic load with the attached L-shaped plate providing thermal enhancement.

11. An active electronic package with a heat spreader comprising:
a heat sink;
a package carried by a space vehicle containing active electronic components that produce heat energy during operation, the package having a heat conductive flat surface on a shear plate in a heat path for the heat energy, and the package being operatively attached to the heat sink; and
an L-shaped plate of thermal pyrolitic graphite encapsulated in aluminum, the L-shaped plate having a long arm attached to the heat conductive flat surface of the package by a heat conductive adhesive for receiving thermal energy from the package and a short arm attached to the heat sink for transferring energy to the heat sink, wherein the heat sink and the package produce a dynamic load and the heat sink and the package are designed to carry the dynamic load with the L-shaped plate providing thermal enhancement.

* * * * *